(12) United States Patent
Hamm et al.

(10) Patent No.: US 6,559,060 B2
(45) Date of Patent: May 6, 2003

(54) PROCESS FOR THE STRUCTURING OF A SUBSTRATE

(75) Inventors: Uwe W. Hamm, Langenau (DE); Markus Kasparek, Oberkirch/Baden (DE); Oliver Jacobs, Ochsenberg (DE)

(73) Assignee: Carl-Zeiss-Stiftung, Heidenheim (DE)

( * ) Notice: Subject to any disclaimer, the term of this patent is extended or adjusted under 35 U.S.C. 154(b) by 34 days.

(21) Appl. No.: 09/951,284

(22) Filed: Sep. 13, 2001

(65) Prior Publication Data

US 2002/0164882 A1 Nov. 7, 2002

(51) Int. Cl.$^7$ .............................................. H01L 21/302
(52) U.S. Cl. ........................ 438/719; 438/712; 438/723
(58) Field of Search .................... 438/710, 712, 438/719, 723

(56) References Cited

U.S. PATENT DOCUMENTS 5,281,302 A    1/1994  Gabric et al.
5,611,850 A  * 3/1997  Nishi et al. ............ 106/287.26
5,685,916 A   11/1997  Ye et al.

FOREIGN PATENT DOCUMENTS

| EP | 296 419 | 12/1988 |
|---|---|---|
| EP | 802 560 | 10/1997 |
| WO | WO 99/49506 | 9/1999 |

* cited by examiner

Primary Examiner—Trung Dang
(74) Attorney, Agent, or Firm—Hudak, Shunk & Farine Co. LPA

(57) ABSTRACT

A process for the structuring of a substrate with structures in the micrometer to nanometer range that does not involve the provision of gaseous fluoro-organic compounds is described. The process is carried out by means of reactive ion etching using a mask arranged on the substrate and a plasma as well as fluorine-containing organic compounds, which fluorine-containing organic compound(s) is/are provided in the form of solid polymers. A process for the etching of a coating on a substrate or the surface of a substrate is also described.

18 Claims, 1 Drawing Sheet

PROCESS FOR THE STRUCTURING OF A SUBSTRATE

FIELD OF THE INVENTION

Figure 1:
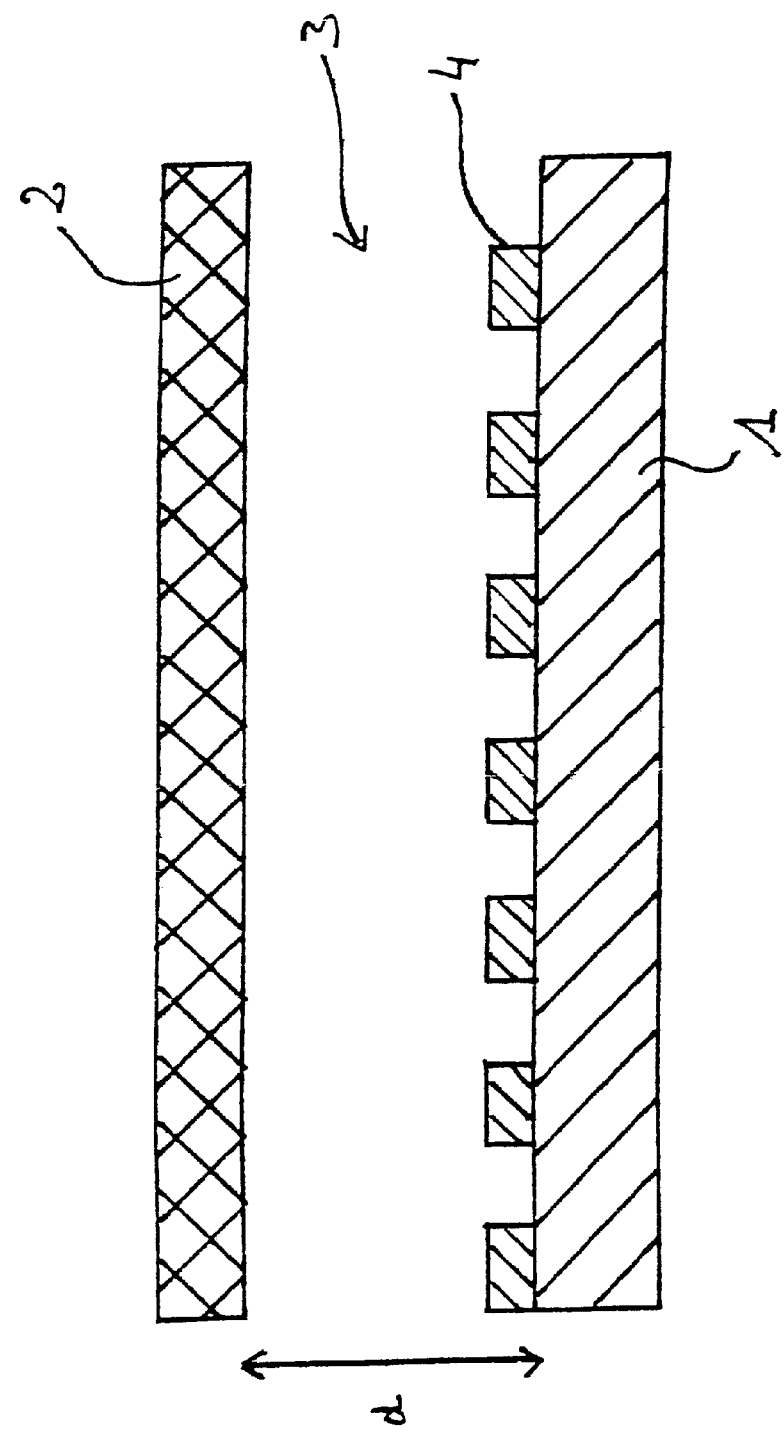

The invention relates to a process for the structuring of a substrate in the micrometer to nanometer range, in particular a substrate of silicon or silicon-oxygen compounds and especially silicon dioxide, by means of reactive ion etching using fluoro-organic compounds. The invention also relates to a process for the etching of a coating on a substrate or the surface of a substrate, in particular for etching silicon, silicon dioxide or molybdenum, by means of reactive ion etching using fluorine-containing organic compounds.

BACKGROUND OF THE INVENTION

In the semiconductor industry, reactive ion etching is used to create structures, in particular on silicon or also quartz. To do so, the substrate to be etched is first coated with a photoresist. The planned structure is imaged on this photoresist layer. The photoresist is developed so that freely accessible regions of substrate are obtained. These freely accessible regions of the substrate are etched using gaseous fluoro-organic compounds such as tetrafluoromethane in a plasma process. In this case, volatile silicon tetrafluoride is created when etching silicon or silicon dioxide.

Reactive ion etching can also be used to remove large-area coatings. This is of importance, for example, in the manufacture of X-ray or UV mirrors using multi-layer systems of Si/Mo on substrates of silicon or silicon oxide, for example. It may be necessary to partly or completely etch away existing layers during the manufacturing process or when recovering previously used substrates.

WO 99/49506 teaches that both silicon and silicon dioxide can be etched using plasmas containing fluorine. To better control various etching operations, e.g. in the case of complex structures, fluorinated carbons can be used to establish side wall passivations by the formation of polytetrafluoroethylene (PTFE). This side wall passivation can later be removed using an oxygen plasma or a plasma based on oxygen mixed with argon, helium or nitrogen.

U.S. Pat. No. 5,281,302 discloses that silicon oxide or silicon nitride as well as organic contaminants, in particular fluorinated hydrocarbons, can be etched using a mixture of fluorinated carbons, ozone and oxygen plasma. These contaminants are converted into carbon dioxide, water and volatile residuals. The silicon dioxide is converted into silicon tetrafluoride and carbon dioxide.

U.S. Pat. No. 5,685,916 relates to a process for the dry cleaning of semiconductor process chambers by means of plasma etching. The contaminants in the process chamber react under the influence of a non-liquid "enhancement" material added to the plasma to form volatile compounds that can be evacuated via a vacuum system. Photoresist, in particular, is suggested as such an "enhancement" material.

EP 0 296 419 A2 discloses a process for etching an object. A gas mixture made of an etch gas such as $CF_3B$; xenon or krypton; and possibly oxygen is provided. A plasma is ignited in this mixture and the object etched with the plasma. An additional solid, preferably graphite, is added to the plasma. The graphite reacts in the plasma with the gas mixture and as a result, etching of the object can be controlled and there is less contamination of the etching chamber with organic compounds.

EP 0 802 560 A1 teaches that silicon oxide can be plasma etched using fluorinated hydrocarbons or fluorinated carbons. $CF_4$, $C_2F_6$, $C_3F_8$ and $CHF_3$ are used, for example. Various fragments, in particular F, CF and $CF_2$ radicals, are formed by the plasma. The fluorine radical etches the silicon dioxide. The other radicals form C—F polymers which can deposit on the process chamber. However, these polymers are in turn etched by the free fluorine radicals and the oxygen released during the decomposition of the silicon oxide.

The disadvantage of the prior art processes is that the organic compounds containing fluorine are added in gaseous form. This is associated with greater logistical effort for the provision of these gases. The process chambers must have additional openings so that the gaseous fluoro-organic compounds can be added to and removed from the process chamber. The process chambers can leak at these locations, possibly leading to contamination of the chamber. Furthermore, some volatile fluoro-organic compounds are toxic, flammable and explosive.

SUMMARY OF THE INVENTION

It is the object of the current invention to provide an ion etching process that does not involve the provision of gaseous fluoro-organic compounds.

DETAILED DESCRIPTION OF THE INVENTION

This object is achieved using a process for the structuring of a substrate with structures in the micro to nanometer range, in particular substrates of silicon or silicon-oxygen compounds and especially silicon dioxide, by means of reactive ion etching using a mask on the substrate and a plasma as well as fluoro-organic compounds, characterized by the fact that the fluoro-organic compound(s) is/are provided in the form of solid polymers.

This object is also furthermore achieved using a process for the etching of a coating on a substrate or the surface of a substrate, in particular for the etching of silicon, silicon dioxide or molybdenum, by means of reactive ion etching using a plasma and fluoro-organic compounds, characterized by the fact that the fluoro-organic compound(s) is/are provided in the form of solid polymers.

It has been found that polymers containing fluorine in the process chamber are decomposed by the plasma generated during reactive ion etching, as a result of which fluorine radicals, elemental fluorine and, depending on the polymer, hydrogen fluoride are released. These remove the material found on the surface of the substrate, and also react with this material to form volatile reaction products, such as SiF if silicon or silicon dioxide is present.

With the process as claimed by the current invention, the reagents required for reactive ion etching can be provided without having to handle gases that are dangerous due to their toxicity, flammability or explosiveness. The process as claimed by the current invention also facilitates a structuring or etching process free of contamination. For in contrast to prior art processes in which contamination can be admitted via the gas lines, gas valves and any leaks at the connections to the process chamber, the process as claimed by the current invention limits the risk of contamination to the time when the polymers containing fluorine are added prior to the start of the process. Unlike with prior art processes in which the localized reaction behavior can only be influenced with difficulty by means of targeted, localized inflows of the reaction gas using in some cases complex nozzle systems while also having to account for convection, the process as claimed in the current invention makes it possible to influence where the reaction occurs by the targeted application of the polymers containing fluorine.

In a preferred embodiment of the process as claimed by the current invention, the organic compound containing fluorine is provided to the process in the form of film. Films are particularly advantageous for large-area applications. If necessary, structures can be easily made in films, such as by punching or cuffing, to establish different local concentrations of fluoro-organic compounds. Furthermore, essentially all fluorine-containing polymers are commercially available as films.

The best results are achieved when the fluorine-containing polymer, in particular the polymer film, is arranged at some distance to the mask and the plasma is ignited between the polymer, in particular the polymer film, and the mask or the substrate. By so doing, the decomposition of the polymer and the decomposition of the substrate occur spatially separated, so that one reaction cannot adversely affect the other.

It has been proven advantageous if the plasma is an oxygen plasma. The presence of oxygen ions and oxygen radicals has an enhancing effect on the formation of the reactive species from the fluorine-containing polymer, such as fluorine and hydrogen fluoride.

Furthermore, the oxygen plasma makes it possible to remove any organic reaction products in the form of carbon dioxide.

The best results were obtained at pressures between 0.5 to 1.5 mbar. Excitation of the plasma is preferably by means of electromagnetic waves in the high-frequency range, the radio frequency range or the microwave range. In the case of microwave frequencies, frequencies in the range of electroncyclotron resonance are preferred.

It is advantageous if the polymer and the substrate surface are parallel. The best results were obtained when a distance between 2 cm and 20 cm was maintained between the polymer and the substrate to be structured.

In addition to chemical etching, material is also removed by means of physical interactions, e.g. sputtering processes. In a preferred embodiment, inert gases such as argon, helium or nitrogen are added to the plasma to increase the sputter component.

Polytetrafluoroethylene, perfluoroalkoxy copolymers and/or polyvinylidene fluoride are preferably used as the organic compounds containing fluorine. Under certain circumstances, the use of tetrafluoroethylene/hexafluoropropylene copolymer, tetrafluoroethylene/ethylene copolymer, tetrafluoroethylene/hexafluoropropylene/vinylidene fluoride terpolymer, polytrifluorochlorethylene, trifluorochlorethylene/ethylene copolymer or polyvinylfluoride can be of advantage.

FIG. 1 schematically shows an example of the relative arrangement of a substrate 1, a mask 4 and a polytetrafluoroethylene film 2. These individual components are located in a coating chamber (not shown). The mask 4 of photoresist was applied to the substrate 1 using lithographic methods. The polytetrafluoroethylene film is arranged at a distance d=5 cm from the substrate. The plasma is ignited in the space 3 between the polytetrafluoroethylene film and the substrate 1. The distance d is chosen such that the etch rate is as homogenous as possible in the substrate plane. The plasma decomposes the polytetrafluoroethylene film 2, freeing fluorine radicals which in turn decompose those locations of the substrate not covered by the mask 4.

EXAMPLE 1

In a plasma reactor, a polytetrafluoroethylene film was arranged at a distance of 6 cm from a quartz substrate. An oxygen partial pressure of 0.5 mbar was established in the plasma reactor at an oxygen flow of 160 mL per minute. Electroncyclotron resonance microwaves with a frequency of 2.45 GHz and a power of 800 W were excited in the plasma reactor. The quartz substrate was exposed to the oxygen plasma for 10 minutes. An etch rate of approximately 2 nm per minute was achieved.

EXAMPLE 2

In a plasma reactor, a polyvinylidene fluoride film was arranged parallel to and at a distance of 5 cm from a multi-layer molybdenum/silicon system. An oxygen partial pressure of 1.4 mbar was established at an oxygen flow rate of 250 mL per minute. Radio frequencies of 3 MHz were excited in the oxygen plasma. Plasma power was 600 W. The silicon reacted with the fluorine to produce volatile silicon tetrafluoride. Volatile molybdenum oxyfluoride was formed during etching of the molybdenum. The multi-layer system of molybdenum and silicon was exposed to the oxygen plasma for 30 minutes. At the end of this period, all silicon and molybdenum layers were eroded down to the substrate.

EXAMPLE 3

A silicon wafer is to be structured. To this end, a film of perfluoroalkoxy copolymer was placed in the plasma reactor. An oxygen partial pressure of 0.9 mbar was established using an oxygen flow of 210 mL per minute. High frequency magnetic waves with a frequency of 13.56 MHz were excited. Plasma power was 700 W. In addition, argon was admixed to the plasma to enhance sputtering. A sufficient structure was achieved after a treatment time of 2 minutes.

What is claimed is:

1. A process for structuring a substrate comprising the steps of: structuring a substrate with structures in the micrometer to nanometer range, in particular substrates of silicon or silicon-oxygen compounds and especially silicon dioxide, by means of reactive ion etching using a mask arranged on the substrate and a plasma, as well as fluorine-containing organic compounds, wherein the fluorine-containing organic compound(s) is/are provided in the form of solid polymers.

2. A process for etching a coating comprising the steps of: etching a coating on a substrate or the surface of a substrate, in particular for etching silicon, silicon dioxide or molybdenum, by means of reactive ion etching using a plasma and fluorine-containing organic compound(s), wherein the fluorine-containing compound(s) is/are provided in the form of solid polymers.

3. A process as claimed in claim 1, wherein the fluorine-containing polymer is in the form of a film.

4. A process as claimed in claim 3, wherein the fluorine-containing polymer, in particular the polymer film, is arranged at a distance from the mask, and that the plasma is ignited in the space between the polymer, in particular the polymer film, and the mask or the substrate.

5. A process as claimed in claim 1, wherein an oxygen plasma is used.

6. A process as claimed in claim 1, wherein pressures between 0.5 and 1.5 mbar are established.

7. A process as claimed in claim 1, wherein a high frequency, radio frequency or microwave plasma is used.

8. A process as claimed in claim 1, wherein the polymer and the substrate surface are parallel to one another.

9. A process as claimed in claim 1, wherein the distance between the polymer and the substrate is between 2 cm and 20 cm.

10. A process as claimed in claim 1, wherein one or more inert gases is admixed with the plasma.

11. A process as claimed in claim 2, wherein the fluorine-containing polymer is in the form of a film.

12. A process as claimed in claim 11, wherein the fluorine-containing polymer, in particular the polymer film, is arranged at a distance from the mask, and that the plasma is ignited in the space between the polymer, in particular the polymer film, and the mask or the substrate.

13. A process as claimed in claim 2, wherein an oxygen plasma is used.

14. A process as claimed in claim 2, wherein pressures between 0.5 and 1.5 mbar are established.

15. A process as claimed in claim 2, wherein a high frequency, radio frequency or microwave plasma is used.

16. A process as claimed in claim 2, wherein the polymer and the substrate surface are parallel to one another.

17. A process as claimed in claim 2, wherein the distance between the polymer and the substrate is between 2 cm and 20 cm.

18. A process as claimed in claim 2, wherein one or more inert gases is admixed with the plasma.

* * * * *